United States Patent [19]

Varshney

[11]  4,409,676

[45]  Oct. 11, 1983

[54] METHOD AND MEANS FOR DIAGNOSTIC TESTING OF CCD MEMORIES

[75] Inventor: Ramesh C. Varshney, San Jose, Calif.

[73] Assignee: Fairchild Camera & Instrument Corporation, Mountain View, Calif.

[21] Appl. No.: 235,804

[22] Filed: Feb. 19, 1981

[51] Int. Cl.³ .............................................. G11C 29/00
[52] U.S. Cl. .................................. 365/201; 324/158 T
[58] Field of Search .......................... 365/201; 371/21; 324/158 T

[56] References Cited

U.S. PATENT DOCUMENTS 3,795,859  3/1974  Benante et al. ....................... 371/21
4,336,495  6/1982  Hapke .............................. 324/158 T

OTHER PUBLICATIONS

Hwang, "Indirect Measurement of Sense Amplifier Unbalance in Dynamic RAM", IBM Tech. Disc. Bul., vol. 23, No. 7A, 12/80, pp. 2906-2907.

Primary Examiner—Stuart N. Hecker
Attorney, Agent, or Firm—Kenneth Olsen; Michael J. Pollock; Carl L. Silverman

[57]  ABSTRACT

Diagnostic testing of a charge coupled device is facilitated by interconnecting the reference node of the sense amplifier for each data block in the CCD device with a probe contact on the device, thereby eliminating the need for applying a microprobe to the sensitive reference node. Reference voltages under different operating conditions can be evaluated by measuring the device generated reference voltage or by applying variable reference voltages through the probe contact to the reference node.

4 Claims, 9 Drawing Figures

NORMAL
OPERATION

DIAGNOSTIC
TEST

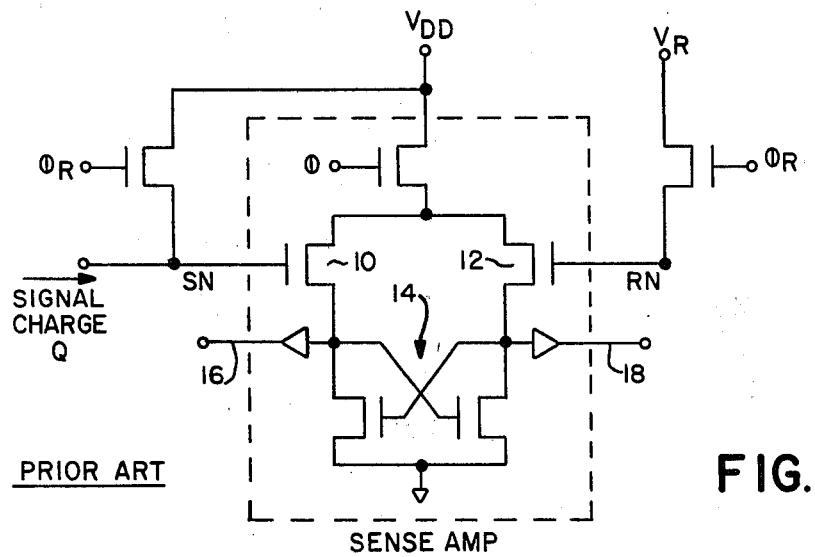
FIG.—1
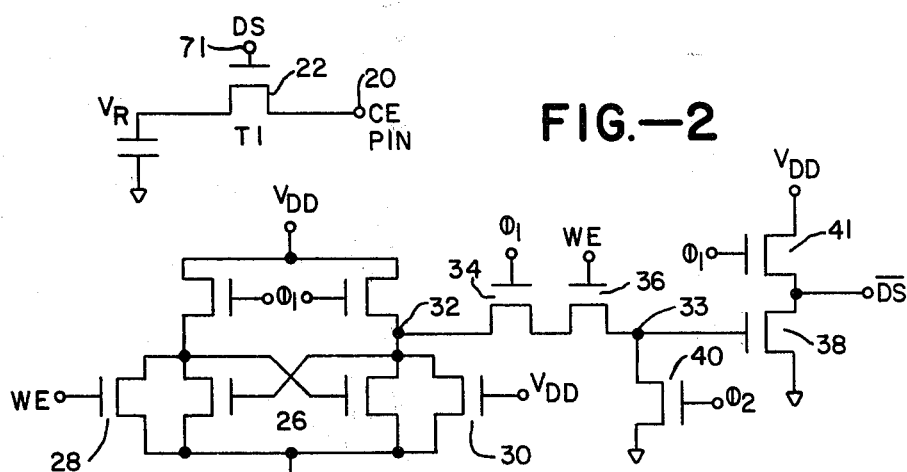
FIG.—2
FIG.—3
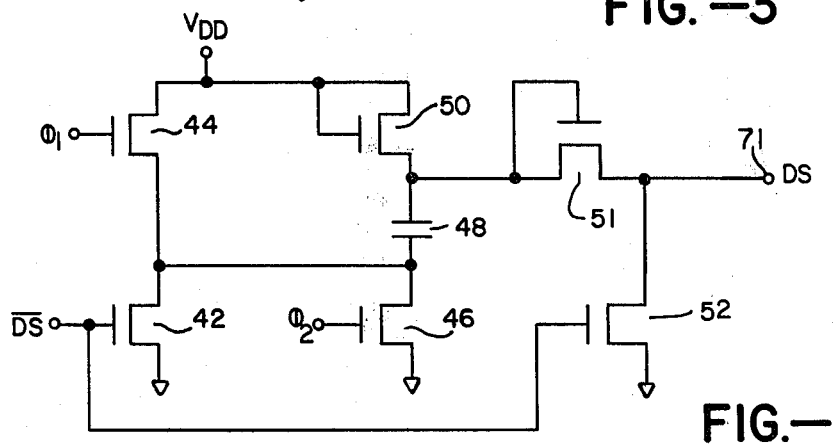
FIG.—4

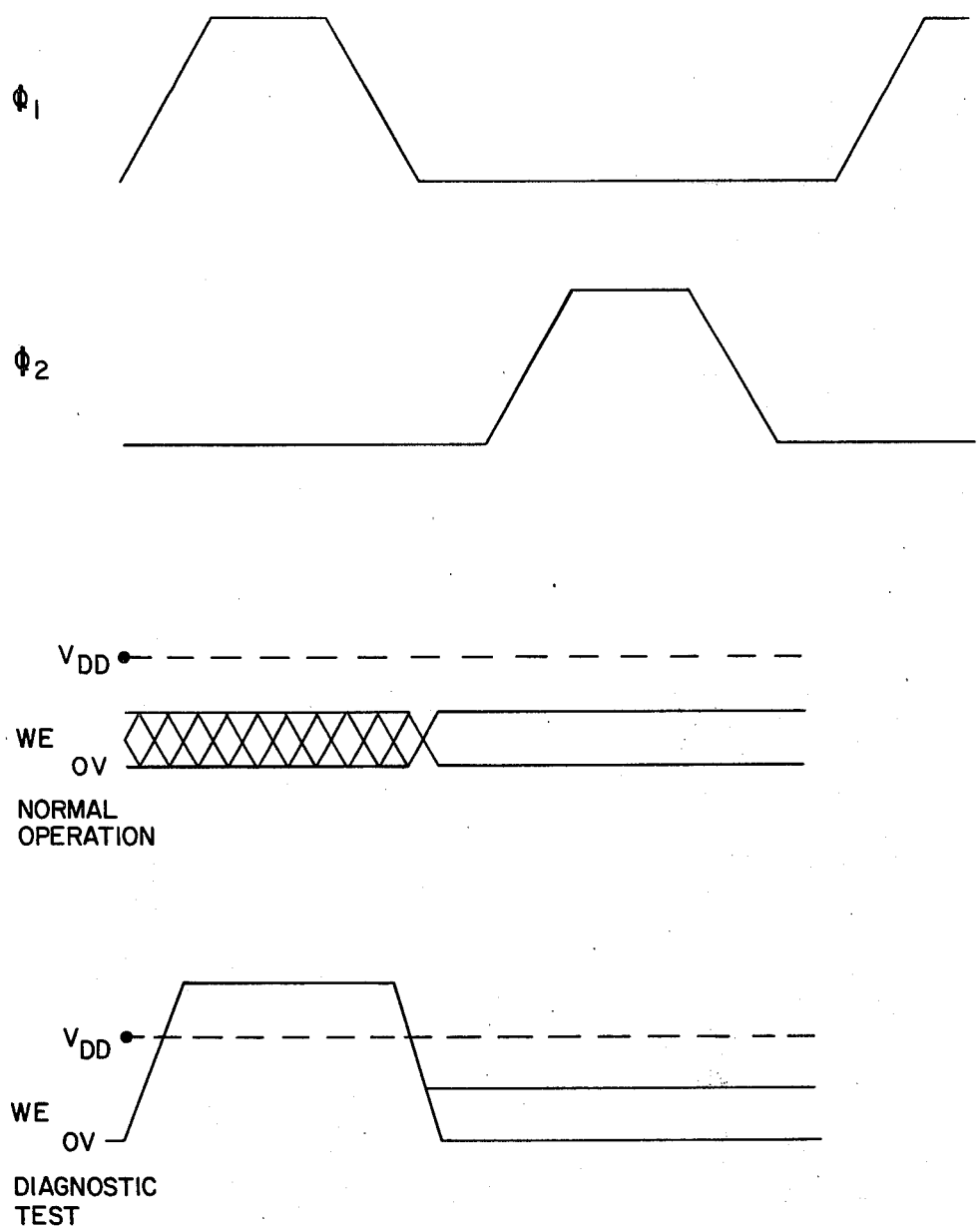
FIG.—5

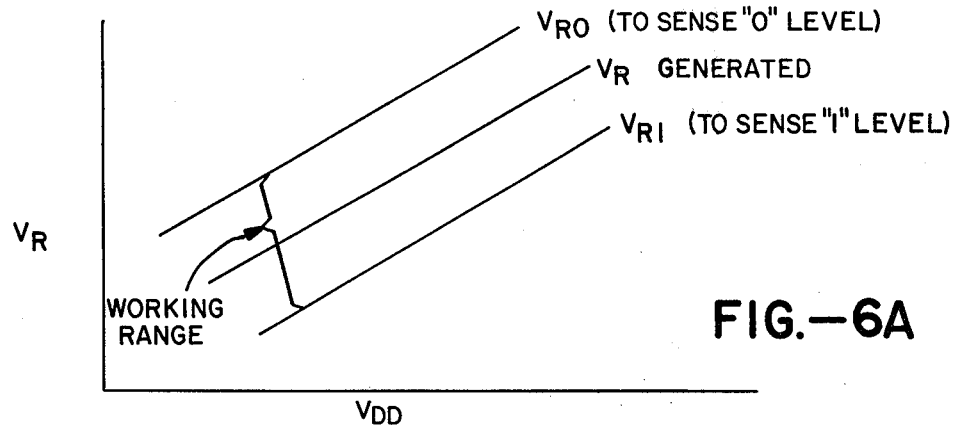
FIG.—6A
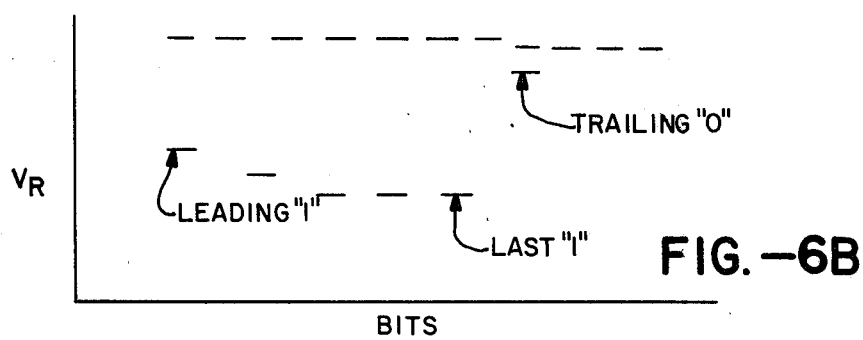
FIG.—6B
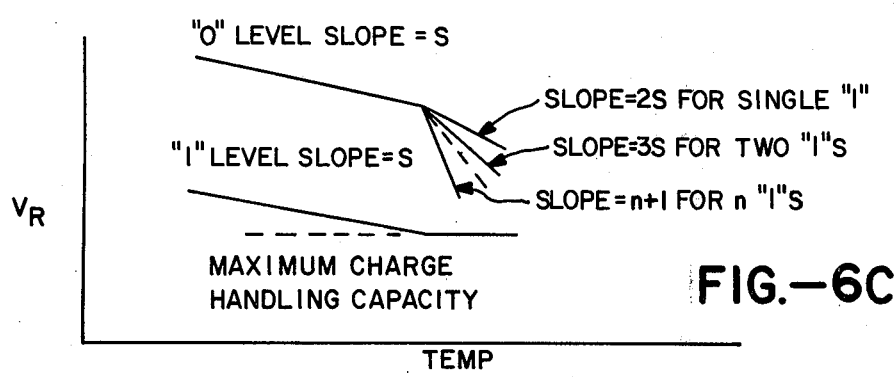
FIG.—6C
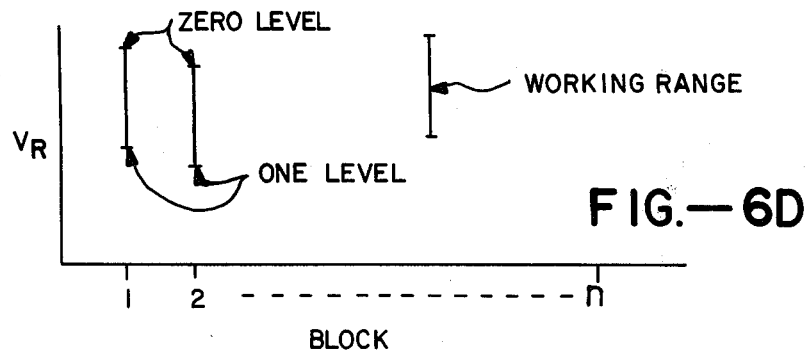
FIG.—6D

METHOD AND MEANS FOR DIAGNOSTIC TESTING OF CCD MEMORIES

This invention relates generally to charge coupled devices (CCDs), and more particularly the invention relates to a method and means for diagnostically testing a CCD memory.

A charge coupled device comprises a plurality of interconnected transfer electrodes which can produce a moving array of electric potential wells. In a memory application the voltage potential or charge in each well can denote a binary "1" or binary "0".

CCD memories and structures are well known in the art. For example, see Varshney, Venkateswaran, and Amelio, U.S. Pat. No. 4,165,541. As disclosed in this patent, the memory is read by means of a sense amplifier which differentially compares the charge in a potential well and a reference charge with a flip-flop of the amplifier responding to the voltage differential on a sense node (indicative of the CCD charge package) and a reference node (indicative of the reference charge packet). The reference charge package is typically equal to half of the maximum charge packages of the CCD memory. Circuitry is also known for generating a reference voltage which is intermediate to a sense node zero charge indicating a binary "0" and a sense node full bucket charge potential indicating a binary "1". See Varshney et al., "A Byte Organized NMOS/CCD Memory With Dynamic Refresh Logic", *IEEE Journal of Solid-State Circuits*, Vol. SC-11, No. 1, February 1976, pp. 18-24. The state of the flip-flop, in response to the sense node and reference node potential differential, is latched for readout in proper time sequence. The memory comprises a plurality of blocks and each block has a sense amplifier for reading data in the block.

A problem in any CCD memory device is establishing and verifying an optimum reference charge to have an equal detection margin for either a "0" or a "1" level of charge in the CCD potential wells. To evaluate the potential well charge and the reference charge or voltage, access to the sense node and reference node of the memory is required. In an unpackaged semiconductor chip these nodes can be accessed by a microprobe. However, in capacitively loading these two nodes by a microprobe, the results of a diagnostic test may not be the same as the sense amplifier would actually behave without the presence of the microprobe.

An object of the present invention is an improved method of diagnostic testing of a CCD memory.

Another object of the invention is means within a CCD memory chip for providing access to the reference voltage within the chip without the need for probing the reference node.

Briefly, in accordance with the invention, a charge coupled memory device having a sense amplifier including a signal node for receiving stored charge and a reference node for receiving a reference voltage is provided with interconnect means for connecting the reference node to an external pin. Means is provided for controlling the interconnect means whereby the reference node is connected to the external pin during the diagnostic testing of a stored charge. In one embodiment the charge coupled memory device operates with two clock signals, $\phi_1$ and $\phi_2$, and a write enable signal, WE, and the reference node is connected to the external pin in response to a diagnostic signal, DS. The external pin can be a pin of a chip package or a bonding pad or contact on the semiconductor chip. As used herein, reference to an external pin includes a bonding pad or contact external to the circuitry also.

In practicing the invention, a device such as a high impedance volt meter is connected to the external pin for measuring the reference voltage during the sensing of a stored charge. Alternatively, a variable voltage source can be connected to the external pin for applying a variable voltage to the reference node whereby the range of the reference voltage can be determined for sensing a binary "1" or a binary "0" charge at the sense node.

The invention and objects and features thereof will be more apparent from the following detailed description and appended claims when taken with the drawing, in which:

FIG. 1 is an electrical schematic of a sense amplifier in a conventional charge coupled memory device.

FIG. 2 is a simplified schematic of one embodiment of the invention.

FIG. 3 and FIG. 4 illustrate the circuitry for generating a diagnostic signal for use in the circuit of FIG. 2.

FIG. 5 illustrates control signals for normal device operation and for diagnostic testing.

FIGS. 6A-6D are plots of measured parameters employing the present invention.

Referring now to the drawings, FIG. 1 is a schematic of a sense amplifier as used in a conventional charge coupled memory device. Stored charge (shown as signal charge Q) is serially applied to a sense node SN, and a reference voltage $V_R$ is applied to a reference node RN. In response to a clock signal $\phi$, the signal charge and reference voltage allow current to flow to transistors 10 and 12, respectively, and depending upon the conductance of transistors 10 and 12 a flip-flop shown generally at 14 assumes one of two stable conditions and provides a readout voltage at nodes 16 and 18 depending upon the relative value of the voltage at the sense node as compared to the reference node. The node SN is periodically precharged to $V_{DD}$ and node RN is periodically precharged to $V_R$ in response to the clock signal $\phi_R$ prior to the application of the signal charge to node SN.

Ideally, the reference charge or voltage is intermediate the maximum and minimum voltage at the sense node representing a binary "1" and a binary "0", respectively. The sense amplifier then has an equal margin to detect the "1" and "0" levels of charge.

To evaluate the charge from memory and the reference voltage access to the sense node and reference node has heretofore been required. However, the application of a microprobe to the two nodes capacitively loads the nodes and the measured voltage may not be the same as the sense amplifier would experience in actual practice.

Another technique to sense the presence or absence of charge is by generating a reference charge by means of a small shift register. This technique has been used commercially and is cost effective when the number of CCD blocks is small. When a large number of CCD blocks or shift registers are used in memory, it has been more advantageous to use a voltage generator for generating a reference voltage. However, microprobing of the reference voltage has been required.

In accordance with the present invention the diagnosis of a CCD memory is accomplished without microprobing the sensitive sense and reference nodes. As illustrated in the schematic of FIG. 2, the reference voltage $V_R$ is interconnected to an external pin 20 through a transistor 22. Conduction of transistor 22 is controlled by a diagnostic signal, DS, which is applied to the gate of transistor 22. Advantageously, the external pin 20 can be an existing pin on the CCD memory which is normally at a high voltage state when the memory is active. For example, in the 64 K bit CCD memory designated by product number F464 and manufactured by Fairchild Camera and Instrument Corporation, a chip enable, CE, pin is provided and is at a high state when the memory is active. Thus, for diagnostic purposes, the CE pin can be employed for reading out the reference voltage or for applying a test voltage to the reference node.

The Fairchild F464 CCD memory, as disclosed in U.S. Pat. No. 4,165,541, utilizes two external clocks, $\phi_1$ and $\phi_2$, and a write enable, WE, signal in memory operation. FIG. 3 and FIG. 4 are schematics of circuits for generating the DS signal for the F464 memory, and FIG. 5 illustrates control signals for normal operation of the testing of the F464 device in accordance with the invention.

In FIG. 3 a cross-coupled flip-flop circuit shown generally at 26 includes transistors 28 and 30 with the gate of transistor 28 connected to receive the WE signal and the gate of transistor 30 connected to $V_{DD}$. Node 32 of flip-flop circuit 30 is connected to a node 33 through serially connected transistors 34 and 36. Node 33 is connected to the gate of transistor 38 and through transistor 40 to ground. Transistor 38 is connected through transistor 41 to $V_{DD}$, and a signal $\overline{DS}$ is taken at the common terminal of transistors 38 and 41.

During normal operation of the F464 memory, the WE signal is less than $V_{DD}$, as shown in FIG. 5, and consequently the biasing of transistors 28 and 30 keeps node 32 at a low voltage level (i.e. near ground). This low voltage is applied to node 33 through transistors 34 and 36 when WE has normal high level during $\phi_1$ time. If WE is at zero level during $\phi_1$ time, the node 32 is isolated from 33 and is kept low by periodically discharging node 33 by transistor 40 during $\phi_1$ high time. Thus, in normal operation transistor 38 is always non-conducting, and the $\overline{DS}$ signal is always high.

For diagnostic test, the WE signal is raised to a voltage higher than $V_{DD}$, as shown in FIG. 5. The voltage at node 32 of flip-flop 26 goes high during $\phi_1$ high time. During the common high time of $\phi_1$ and WE, the serially connected transistors 34 and 36 apply the high voltage at node 32 to the node 33, thereby rendering transistor 38 conductive and $\overline{DS}$ goes low. Since transistor 41 is off after $\phi_1$ goes low, $\overline{DS}$ remains low during the rest of the cycle and during subsequent cycles so long as WE is kept higher than $V_{DD}$ during at least a portion of each $\phi_1$ clock high time.

In FIG. 4, the signal DS is generated in a voltage doubler circuit in which transistors 42 and 44 are serially connected between $V_{DD}$ and ground with transistor 46, capacitor 48, and transistor 50 also serially connected between $V_{DD}$ and ground. The common terminal of transistors 42 and 44 is connected to the common terminal of transistor 46 and capacitor 48. The common terminal of capacitor 48 and transistor 50 is connected through unidirectionally conductive transistor 51 to a DS output. The DS output is connected through transistor 52 to ground. The $\overline{DS}$ signal is applied to the gates of transistors 42 and 52, the $\phi_1$ clock is applied to the gate of transistor 44, and the $\phi_2$ clock is applied to the gate of transistor 46.

In operation, the voltage at the common terminal of capacitor 48 and transistor 50 is essentially doubled by establishing a nearly $V_{DD}$ voltage ($V_{DD}-V_T$, where $V_T$ is the threshold of device 50) across capacitor 48 during $\phi_2$ clock time when one terminal of capacitor 48 is grounded through transistor 46. During $\phi_1$ clock period a nearly $V_{DD}$ voltage $V\phi_1-V_T$ where $V\phi_1$ is the high voltage level of $\phi_1$ and $V_T$ is the threshold of the device 44) is applied through transistor 44 to the previously grounded terminal of capacitor 48 whereby the voltage on the opposing plate of capacitor 48 becomes approximately two $V_{DD}$. This coupled voltage is then transmitted through transistor 51 to the terminal for the DS signal and raises its potential by transferring the charge from the upper plate of the capacitor to node 71. The rise in potential of node 71 depends upon the ratio of its capacitive loading and the magnitude of capacitance 48. This process of charge pumping continues for several cycles and the voltage of DS keeps on increasing until the voltage reaches to a value which is equal to a $V_T$ below the voltage level at the upper plate of capacitor 48 during $\phi_1$ high time. Once the voltage of DS becomes higher than $V_{DD}$, $V_R$ is connected to the CE pin, as shown in FIG. 2, allowing $V_R$ to be accessed from the CE pin.

FIGS. 6A-6D are illustrative plots of parameters which can be determined by employing the diagnostic technique according to the invention. In FIG. 6A the operable voltage range of the reference node voltage, $V_R$, is shown as a function of $V_{DD}$ in order to sense both a zero level ($V_{R0}$) and a one level ($V_{R1}$) at the sense node.

The charge transfer efficiency of the charge coupled devices may be measured by using this technique for a sequence of "1" charges and a trailing "0" charge and is shown in FIG. 6B. In FIG. 6C the "1" and "0" voltage levels can be determined as a function of temperature with the slope of the "0" level lines evaluated for one or more sequential "1" bits of information. The slope increases as the number of sequential "1" bits increases. In FIG. 6C the maximum charge capacity for each block in a memory having several blocks can be determined by illuminating the chip with uniform light or heating the chip to a higher temperature. FIG. 6D illustrates a method of measuring operating reference voltage range for different n blocks of a CCD memory, where n is the number of blocks.

Thus, by using an external pin which can be selectively interconnected with the reference node of a sense amplifier, various diagnostic testing can be employed with a charge coupled integrated device. While the invention has been described with reference to several embodiments, the description is illustrative of the invention and is not to be construed as limiting the invention. Various modifications and applications may occur to those skilled in the art without departing from the true spirit and scope of the invention as defined by the appended claims.

What is claimed is:

1. In a charge coupled memory device having a reference voltage node for receiving a reference voltage and a first and a second external pin for receiving a first and a second external control signal, respectively, a memory testing apparatus comprising:

means coupled to said reference voltage node and said first and second external pins which is responsive to a control signal applied to said first external pin for connecting said reference voltage node to said second external pin.

2. A memory testing apparatus according to claim 1 wherein said memory device comprises means for receiving a pair of clock signals, $\phi_1$ and $\phi_2$, and said connecting means comprises means coupled to said clock signal receiving means which is responsive to said clock signals and said control signal applied to said first external pin for connecting said reference voltage node to said second external pin.

3. A memory testing apparatus according to claim 2 wherein said memory device comprises means for receiving a voltage level $V_{DD}$ and said connecting means comprises a bistable circuit means coupled to said voltage level receiving means which is responsive to said control and clock signals for connecting said reference voltage node to said second external pin when said control signal exceeds said voltage level $V_{DD}$ by a predetermined magnitude.

4. A memory testing apparatus according to claim 3 wherein the magnitude of said control signal, when it exceeds said predetermined magnitude, comprises a magnitude which exceeds the magnitude of control signals normally applied to said first external pin.

* * * * *